United States Patent
Mizutani

(10) Patent No.: US 11,767,595 B2
(45) Date of Patent: Sep. 26, 2023

(54) CHEMICAL LIQUID, CHEMICAL LIQUID CONTAINER, AND METHOD FOR TREATING SUBSTRATE

(71) Applicant: FUJIFILM Corporation, Tokyo (JP)

(72) Inventor: Atsushi Mizutani, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/158,061

(22) Filed: Jan. 23, 2023

(65) Prior Publication Data

US 2023/0160072 A1    May 25, 2023

Related U.S. Application Data

(63) Continuation of application No. PCT/JP2021/024464, filed on Jun. 29, 2021.

(30) Foreign Application Priority Data

Jul. 31, 2020 (JP) ................................. 2020-130455

(51) Int. Cl.
*C23F 1/30* (2006.01)

(52) U.S. Cl.
CPC ...................... *C23F 1/30* (2013.01)

(58) Field of Classification Search
CPC ...... C23F 1/16; C23F 1/30; C23F 1/38; C23F 1/40

See application file for complete search history.

(56) References Cited

U.S. PATENT DOCUMENTS

| 2003/0017419 A1 | 1/2003 | Futase et al. |
| 2021/0309942 A1 | 10/2021 | Shimoda et al. |
| 2021/0388508 A1* | 12/2021 | Sato .................. C23F 1/40 |
| 2022/0298416 A1* | 9/2022 | Kikkawa ............ C23F 1/32 |

(Continued)

FOREIGN PATENT DOCUMENTS

| JP | 2001-240985 A | 9/2001 | |
| JP | 2016-030778 A | 3/2016 | |
| WO | WO-2011125603 A1 * | 10/2011 | ......... C08G 73/0266 |

(Continued)

OTHER PUBLICATIONS

International Search Report dated Sep. 14, 2021 from the International Searching Authority in International Application No. PCT/JP2021/024464.

(Continued)

*Primary Examiner* — Binh X Tran
(74) *Attorney, Agent, or Firm* — Sughrue Mion, PLLC

(57) ABSTRACT

The present invention provides a chemical liquid that has an excellent ruthenium dissolving ability and leaves small amounts of residual ruthenium and sodium, a chemical liquid container, and a method for treating a substrate. The chemical liquid according to an embodiment of the present invention is a chemical liquid used for removing a ruthenium-containing substance on a substrate. The chemical liquid contains hypochlorous acid or a salt thereof and bromic acid or a salt thereof, in which a content of the hypochlorous acid or a salt thereof is 0.1% to 9.0% by mass with respect to a total mass of the chemical liquid, and a content of the bromic acid or a salt thereof is 0.001 to 15.0 ppm by mass with respect to the total mass of the chemical liquid.

20 Claims, 2 Drawing Sheets

(56) References Cited

U.S. PATENT DOCUMENTS

2022/0328320 A1* 10/2022 Kikkawa .......... H01L 21/32134

FOREIGN PATENT DOCUMENTS

| WO | WO-2014178326 A1 * | 11/2014 | ................ C23F 1/28 |
| WO | 2019/225541 A1 | 11/2019 | |

OTHER PUBLICATIONS

Written Opinion dated Sep. 14, 2021 from the International Searching Authority in International Application No. PCT/JP2021/024464.
International Preliminary Report on Patentability with the translation of Written Opinion dated Jan. 31, 2023 from the International Bureau in International Application No. PCT/JP2021/024464.

* cited by examiner

CHEMICAL LIQUID, CHEMICAL LIQUID CONTAINER, AND METHOD FOR TREATING SUBSTRATE

CROSS-REFERENCE TO RELATED APPLICATIONS

This application is a Continuation of PCT International Application No. PCT/JP2021/024464 filed on Jun. 29, 2021, which claims priority under 35 U.S.C. § 119(a) to Japanese Patent Application No. 2020-130455 filed on Jul. 31, 2020. The above applications are hereby expressly incorporated by reference, in its entirety, into the present application.

BACKGROUND OF THE INVENTION

1. Field of the Invention

The present invention relates to a chemical liquid, a chemical liquid container, and a method for treating a substrate.

2. Description of the Related Art

With the miniaturization of semiconductor products, it is increasingly required that a step of removing unnecessary transition metal-containing substances on a substrate in a semiconductor product manufacturing process be performed with high efficiency and high accuracy.

Generally, regarding the semiconductor product manufacturing process, a method is widely known in which a chemical liquid that dissolves an object including a transition metal is used to perform etching or to remove foreign substances having adhered to a solid surface.

For example, WO2019/225541A discloses a quaternary alkylammonium hypochlorite solution.

SUMMARY OF THE INVENTION

Incidentally, in recent years, in the case of removal of ruthenium-containing substance on a substrate, an excellent ruthenium dissolving ability has been further required.

Furthermore, it has been also required that the amount of residual ruthenium on the substrate and the amount of residual sodium be small after the removal treatment using the chemical liquid.

As a result of studying a ruthenium-containing substance by using the chemical liquid disclosed in WO2019/225541A, the inventors of the present invention have found that the chemical liquid is poor in at least one of the performances including a ruthenium dissolving ability, the amount of residual ruthenium, and the amount of residual sodium.

Therefore, an object of the present invention is to provide a chemical liquid that has an excellent ruthenium dissolving ability and leaves small amounts of residual ruthenium and sodium.

Another object of the present invention is to provide a chemical liquid container and a method for treating a substrate.

That is, the inventors of the present invention have found that the above objects can be achieved by the following constitution.

[1] A chemical liquid used for removing a ruthenium-containing substance on a substrate, containing hypochlorous acid or a salt thereof and bromic acid or a salt thereof, in which a content of the hypochlorous acid or a salt thereof is 0.1% to 9.0% by mass with respect to a total mass of the chemical liquid, and a content of the bromic acid or a salt thereof is 0.001 to 15.0 ppm by mass with respect to the total mass of the chemical liquid.

[2] The chemical liquid described in [1], in which a mass ratio of the content of the hypochlorous acid or a salt thereof to the content of the bromic acid or a salt thereof is $1.0 \times 10^3$ to $1.0 \times 10^7$.

[3] The chemical liquid described in [1] or [2], further containing chloric acid or a salt thereof, in which a content of the chloric acid or a salt thereof is 0.0001 to 500.0 ppm by mass with respect to the total mass of the chemical liquid.

[4] The chemical liquid described in any one of [1] to [3], in which the hypochlorous acid or a salt thereof includes a quaternary ammonium salt of the hypochlorous acid.

The chemical liquid described in any one of [1] to [3], in which the hypochlorous acid or a salt thereof is a quaternary ammonium salt.

[5] The chemical liquid described in any one of [1] to [4], further containing a buffer, in which the buffer includes at least one buffer selected from the group consisting of a boric acid buffer, an amine buffer, a phosphoric acid buffer, and an organic buffer.

[6] The chemical liquid described in any one of [1] to [5], further containing a chelating agent, in which the chelating agent includes at least one chelating agent selected from the group consisting of a carboxylic acid, an aminopolycarboxylic acid, and phosphonic acid.

[7] The chemical liquid described in any one of [1] to [6], in which a pH of the chemical liquid is 7.0 to 13.0.

[8] A chemical liquid container having a container that contains a coloring pigment and the chemical liquid described in any one of [1] to [7] that is stored in the container.

[9] A method for treating a substrate, including a step A of removing a ruthenium-containing substance on a substrate by using the chemical liquid described in any one of [1] to [7].

The method for treating a substrate described in [9], in which the step A is a step A1 of performing a recess etching treatment on a ruthenium-containing wiring line disposed on a substrate by using the chemical liquid, a step A2 of removing a ruthenium-containing film at an outer edge of a substrate, on which the ruthenium-containing film is disposed, by using the chemical liquid, a step A3 of removing a ruthenium-containing substance attached to a back surface of a substrate, on which a ruthenium-containing film is disposed, by using the chemical liquid, a step A4 of removing a ruthenium-containing substance on a substrate, which has undergone dry etching, by using the chemical liquid, or a step A5 of removing a ruthenium-containing substance on a substrate, which has undergone a chemical mechanical polishing treatment, by using the chemical liquid.

According to an aspect of the present invention, it is possible to provide a chemical liquid that has an excellent ruthenium dissolving ability and leaves small amounts of residual ruthenium and sodium.

Furthermore, according to an aspect of the present invention, it is possible to provide a chemical liquid container and a method for treating a substrate.

DESCRIPTION OF THE PREFERRED EMBODIMENTS

Figure 1:
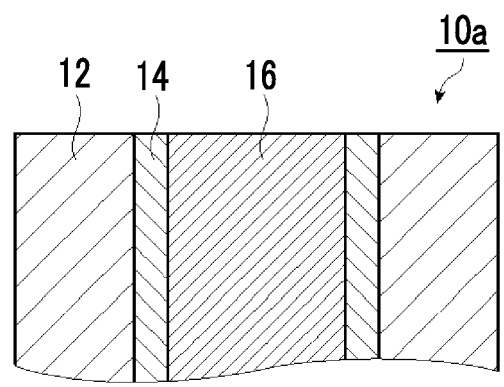
FIG. 1 is a schematic cross-sectional top view showing an example of an object to be treated used in a step A1.

The following constituents will be described based on typical embodiments of the present invention in some cases, but the present invention is not limited to the embodiments.

In the present specification, as long as the effects of the present invention are not reduced, the description of a group (atomic group) that is not clarified regarding whether it is substituted or unsubstituted includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, in a case where there are two or more kinds of components corresponding to a certain component, "content" of such a component means the total content of the two or more kinds of components.

In the present specification, "ppm" means "parts-per-million ($10^{-6}$)", "ppb" means "parts-per-billion ($10^{-9}$)", and "ppt" means "parts-per-trillion ($10^{-12}$)".

Unless otherwise specified, a compound described in the present specification may include isomers (compounds having the same number of atoms and different structures), optical isomers, and isotopes. In addition, the compound may include only one isomer and only one isotope or a plurality of isomers and isotopes.

In the present specification, a dry etching residue is a by-product generated as a result of performing dry etching (for example, plasma etching). For example, the dry etching residue refers to an organic residue derived from a photoresist, a Si-containing residue, and a metal-containing residue (for example, a transition metal-containing residue).

Chemical Liquid

The chemical liquid according to an embodiment of the present invention is a chemical liquid used for removing a ruthenium-containing substance on a substrate. The chemical liquid contains hypochlorous acid or a salt thereof (hereinafter, also called "hypochlorous acids") and bromic acid or a salt thereof (hereinafter, also called "bromic acids"), in which a content of the hypochlorous acid or a salt thereof is 0.1% to 9.0% by mass with respect to a total mass of the chemical liquid, and a content of the bromic acid or a salt thereof is 0.001 to 15.0 ppm by mass with respect to the total mass of the chemical liquid.

The content of the hypochlorous acids with respect to the total mass of the chemical liquid is preferably 0.5% to 7.5% by mass, and more preferably 1.0% to 3.0% by mass.

The content of the bromic acids with respect to the total mass of the chemical liquid is preferably 0.001 to 15.0 ppm by mass, and more preferably 0.002 to 15.0 ppm by mass.

It is unclear through what mechanism the objects of the present invention are achieved by the aforementioned chemical liquid. According to the inventors of the present invention, the mechanism is assumed to be as below.

In a case where the chemical liquid contains a predetermined amount of hypochlorous acids, an excellent ruthenium dissolving ability can be realized. In addition, presumably, in a case where the chemical liquid contains a predetermined amount of hypochlorous acids and bromic acids, amounts of residual ruthenium and sodium may be reduced.

The content of the hypochlorous acids or bromic acids in the chemical liquid can be determined by ion chromatography. Specific examples of devices include a Dionex ICS-2100 manufactured by Thermo Fisher Scientific Inc. and a Prominence bromic acid analysis system manufactured by Shimadzu Corporation. In a case where the composition of raw materials is known, the content of the hypochlorous acids or bromic acids may be calculated from the amount of the raw materials used. In a case where the content of the hypochlorous acids or bromic acids in the chemical liquid is equal to or lower than the measurement limit, a concentrated liquid obtained by concentrating the chemical liquid may be used for analysis.

Hypochlorous Acids

The chemical liquid contains hypochlorous acids (hypochlorous acid or a salt thereof).

The hypochlorous acids preferably include a salt of hypochlorous acid.

Examples of the salt of hypochlorous acid include salts of alkali metal elements (such as sodium and potassium), salts of alkaline earth metal elements (such as magnesium and calcium), salts of other metal elements, and quaternary ammonium salts. Among these, a salts of alkali metal elements (preferably sodium) or quaternary ammonium salts are preferable, and quaternary ammonium salts are more preferable.

Quaternary Ammonium Salt

The quaternary ammonium salt is not particularly limited as long as it is a salt consisting of a hypochlorite anion and a quaternary ammonium cation.

The quaternary ammonium cation is not particularly limited as long as it is a cation formed by the substitution of a nitrogen atom with 4 hydrocarbon groups. As the quaternary ammonium cation, a cation represented by Formula (1) is preferable.

(1)

In Formula (1), $R^1$ to $R^4$ each independently represent an alkyl group, a hydroxyalkyl group, a benzyl group, or an aryl group.

As the alkyl group, an alkyl group having 1 to 6 carbon atoms is preferable, a methyl group, an ethyl group, a propyl group, or a butyl group is more preferable, and a methyl is even more preferable.

As the hydroxyalkyl group, a hydroxyalkyl group having 1 to 6 carbon atoms is preferable, and a hydroxymethyl group, a hydroxyethyl group, a hydroxypropyl group, or a hydroxybutyl group is more preferable.

The aryl group is preferably a phenyl group or a naphthyl group, and more preferably a phenyl group.

As $R^1$ to $R^4$, an alkyl group having 1 to 6 carbon atoms, a hydroxyalkyl group having 1 to 6 carbon atoms, or a benzyl group is preferable, a methyl group, an ethyl group, a propyl group, a butyl group, or a hydroxyethyl group is more preferable, a methyl group or an ethyl group is even more preferable, and a methyl group is particularly preferable.

$R^1$ to $R^4$ preferably represent groups having the same structure.

Examples of the cation represented by Formula (1) include a tetramethylammonium cation, a tetraethylammonium cation, an ethyltrimethylammonium cation, a tetrabutylammonium cation, a trimethyl(2-hydroxyethyl)ammonium cation, a dimethyldi(2-hydroxyethyl)ammonium cation, a methyltri(2-hydroxyethyl)ammonium cation, a tetra(2-hydroxyethyl)ammonium cation, and a trimethylbenzylammonium cation.

Among these, a tetramethylammonium cation is preferable.

Examples of the cation represented by Formula (1) also include the quaternary ammonium cation contained in quaternary ammonium hydroxide described in JP2015-518068A.

As the hypochlorous acids, hypochlorous acid (HClO), sodium hypochlorite (NaCl), potassium hypochlorite (KClO), calcium hypochlorite (Ca(ClO)2), or tetramethylammonium chlorite is preferable, sodium hypochlorite or tetramethylammonium hypochlorite is more preferable, and tetramethylammonium hypochlorite is even more preferable.

One kind of hypochlorous acids may be used alone, or two or more kinds of hypochlorous acids may be used.

Bromic Acids

The chemical liquid contains bromic acids.

Examples of salts of bromic acid include the salts included in the hypochlorous acids described above. Among these, salts of alkali metal elements (such as sodium and potassium) or salts of alkaline earth metal elements (such as magnesium and calcium) are preferable.

As the bromic acids, bromic acid, sodium bromate, potassium bromate, or calcium bromate is preferable, and bromic acid is more preferable.

One kind of bromic acids may be used alone, or two or more kinds of bromic acids may be used.

In view of further improving the effects of the present invention, the mass ratio of the content of the hypochlorous acid to the content of the bromic acids [content of hypochlorous acids/content of bromic acids] is preferably $1.0 \times 10^2$ to $1.0 \times 10^8$, more preferably $1.0 \times 10^3$ to $1.0 \times 10^7$, and even more preferably $1.5 \times 10^3$ to $1.0 \times 10^7$.

Chloric Acid or Salt Thereof

The chemical liquid may contain chloric acid or a salt thereof (hereinafter, also called "chloric acids").

Examples of salts of chloric acid include the salts included in the hypochlorous acids described above. Among these, salts of alkali metal elements (such as sodium and potassium) or salts of alkaline earth metal elements (such as magnesium and calcium) are preferable.

As the chloric acids, chloric acid, sodium chlorate, potassium chlorate, or calcium chlorate is preferable.

One kind of chloric acids may be used alone, or two or more kinds of chloric acids may be used.

In view of further improving the effects of the present invention, the content of the chloric acids with respect to the total mass of the chemical liquid is preferably 0.0001 to 500.0 ppm by mass, and more preferably 0.001 to 10.0 ppm by mass.

The content of the chloric acids can be measured by the same method as the method used for measuring the content of the hypochlorous acids or bromic acids described above.

pH

In view of further improving the effects of the present invention, the pH of the chemical liquid is preferably 7.0 to 14.0, more preferably 7.0 to 13.0, even more preferably 8.0 to 13.0, particularly preferably 9.0 to 13.0, and most preferably 9.5 to 12.0.

Using the hypochlorous acids, bromic acids, and chloric acids described above and optional components that will be described later (for example, a buffer, a chelating agent, a pH adjuster, and the like) makes it possible to adjust the pH of the chemical liquid.

The pH of the chemical liquid is a pH of the chemical liquid at 25° C., and can be measured by a method based on JIS Z8802-1984 by using a known pH meter.

Optional Component

The chemical liquid may contain an optional component in addition to the aforementioned components.

Examples of the optional component include a solvent, a buffer, a chelating agent, a pH adjuster, an amine compound, a surfactant, an anticorrosive, a reducing agent, and various additives.

The chemical liquid preferably contains at least one optional component selected from the group consisting of a buffer and a chelating agent.

One optional component may be used alone, or two or more optional components may be used.

Hereinafter, the optional component will be described.

Solvent

The chemical liquid may contain a solvent.

Examples of the solvent include water and an organic solvent. Among these, water is preferable.

Water may contain a trace of components that are unavoidably mixed in. Particularly, water having undergone a purification treatment such as distilled water, deionized water, or ultrapure water is preferable, and ultrapure water used for manufacturing semiconductors is more preferable.

The content of water in the chemical liquid is not particularly limited. The concentration of water in the chemical liquid with respect to the total mass of the chemical liquid is preferably 50.0% by mass or more, more preferably 60.0% by mass or more, even more preferably 85.0% by mass or more, and particularly preferably 90.0% by mass or more. The upper limit of the concentration of water is not particularly limited, but is preferably 99.9% by mass or less with respect to the total mass of the chemical liquid.

Buffer

The buffer is a compound that performs a buffering action in the chemical liquid.

The buffer is a compound different from the aforementioned components contained in the chemical liquid.

Examples of the buffer include a boric acid buffer, a phosphoric acid buffer, a carbonic acid buffer, an amine buffer, and an organic buffer.

Among these, the buffer preferably includes at least one buffer selected from the group consisting of a boric acid buffer, an amine buffer, a phosphoric acid buffer, and an organic buffer, and more preferably includes at least one buffer selected from the group consisting of an amine buffer, a phosphoric acid buffer, and an organic buffer.

Examples of the boric acid buffer include boric acid; an alkali metal borate such as sodium borate and potassium borate; an alkaline earth metal borate such as calcium borate, magnesium borate, and manganese borate; and ammonium borate.

Examples of the phosphoric acid buffer include phosphoric acid; alkali metal phosphate such as disodium hydrogen phosphate, sodium dihydrogen phosphate, trisodium phosphate, potassium phosphate, potassium dihydrogen phosphate, and tripotassium phosphate; alkaline earth metal phosphate such as calcium phosphate, calcium hydrogen phosphate, calcium dihydrogen phosphate, magnesium phosphate monobasic, magnesium phosphate dibasic (magnesium hydrogen phosphate), and magnesium phosphate tribasic; ammonium phosphate such as diammonium hydrogen phosphate and ammonium dihydrogen phosphate.

Examples of the carbonic acid buffer include carbonic acid; alkali metal carbonate such as sodium carbonate, sodium hydrogen carbonate, and potassium carbonate; and alkaline earth metal carbonate such as calcium carbonate and magnesium carbonate.

Examples of the amine buffer include aqueous ammonia, an ammonium salt, 2-amino-2-methyl-1,3-propanediol, 2-amino-2-methyl-1-propanol, bis(2-hydroxyethyl)iminotris(hydroxymethyl) methane, 2-amino-2-methyl-1-propanol (AMP), 2-ethylaminoethanol, N-methyl-D-glutamine, diethanolamine, triethanolamine, trishydroxymethyl aminomethane, and imidazole.

Examples of the organic buffer include glycine, glycine derivatives, and Good's buffers.

Examples of glycine and glycine derivatives include glycine, acetamide glycine, tricine, glycinamide, and vicine.

Examples of the Good's buffers include ACES (N-(2-acetamido)-2-aminoethanesulfonic acid), ADA (N-(carbamoylmethyl)iminodiacetic acid), BES (N,N-bis(2-hydroxyethyl)-2-aminoethanesulfonic acid), Bicine (N, N-bis(2-hydroxyethyl)glycine), Bis-Tris (bis(2-hydroxyethyl) iminotris(hydroxymethyl)methane), CAPS (3-cyclohexylaminopropane sulfonic acid), CAPSO (4-(cyclohexylamino)-1-butanesulfonic acid), CHES (N-cyclohexyl-2-aminoethanesulfonic acid), DIPSO (3-(N,N-bis[2-hydroxyethyl] amino)-2-hydroxypropanesulfonic acid), EPPS (4-(2-hydroxyethyl)-1-piperazine propanesulfonic acid), HEPES (4-2-hydroxyethyl-1-piperazine ethanesulfonic acid), HEPPSO (N-(hydroxyethyl)piperazine-N'-2-hydroxypropanesulfonic acid), MES (2-(N-morpholino)ethanesulfonic acid), MOPS (3-(N-morpholino)propanesulfonic acid), MOPSO (2-hydroxy-3-morpholinopropanesulfonic acid), PIPES (piperazine-N,N'-bis(2-ethanesulfonic acid)), POPSO (piperazine-1,4-bis(2-hydroxypropanesulfonic acid)), TAPS (N-tris(hydroxymethyl)methyl-3-aminopropanesulfonic acid), TAPSO (3-[N-tris(hydroxymethyl)methylamino]-2-hydroxypropanesulfonic acid), TES (N-tris(hydroxymethyl)methyl-2-aminoethanesulfonic acid), and tricine (N-tris(hydroxymethyl)methyl glycine).

Among these, as the organic buffer, CHES, CAPSO, or CAPS is preferable, and CAPSO or CAPS is more preferable.

The pKa (acid dissociation constant) of the buffer is preferably 9.00 or more, and more preferably 10.00 or more. The lower limit of the pKa is not particularly limited, and is preferably 14.00 or less and more preferably 13.00 or less.

The pKa is a value calculated based on Hammett's substituent constants and the database in publications by using a software package (Advanced Chemistry Development (ACD/Labs) Software V8.14 for Solaris (1994-2007 ACD/Labs)).

One buffer may be used alone, or two or more buffers may be used in combination.

The content of the buffer with respect to the total mass of the chemical liquid is preferably 10% by mass or less, more preferably 5% by mass or less, and even more preferably 1% by mass or less. The lower limit of the content of the buffer is not particularly limited. The lower limit of the content of the buffer with respect to the total mass of the chemical liquid is preferably 0.01% by mass or more, and more preferably 0.05% by mass or more.

Chelating Agent

The chemical liquid may contain a chelating agent.

The chelating agent is a compound having one or more coordinating groups (for example, a group containing a nitrogen atom) in a molecule.

The chelating agent is a compound different from the aforementioned components contained in the chemical liquid.

Examples of the chelating agent include a carboxylic acid, an amino polycarboxylic acid, phosphonic acid, and a biguanide compound.

Among these, the chelating agent preferably includes at least one chelating agent selected from the group consisting of a carboxylic acid, an amino polycarboxylic acid, and phosphonic acid, and more preferably includes at least one chelating agent selected from the group consisting of an amino polycarboxylic acid and phosphonic acid.

As the chelating agent, a compound represented by Formula (A1) is preferable, and a compound represented by Formula (A2) is more preferable.

$$R^{a1}\text{-L-}R^{a2} \qquad \text{Formula (A1)}$$

In Formula (A1), $R^{a1}$ and $R^{a2}$ each independently represent $-CO_2H$ or $-PO_3H_2$.

L represents an alkylene group which may have a heteroatom.

The alkylene group may be chain-like, branched chain-like, or cyclic (may be monocyclic or polycyclic).

As the heteroatom that the alkylene group has, a nitrogen atom or an oxygen atom is preferable, and a nitrogen atom is more preferable.

The number of carbon atoms in the alkylene group is preferably 1 to 20, more preferably 1 to 15, and even more preferably 1 to 10.

The alkylene group may further have a substituent. The substituent is preferably a hydroxy group or a carboxyl group.

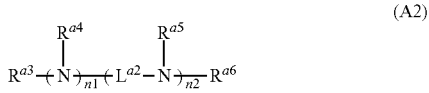

(A2)

In Formula (A2), $R^{a3}$ to $R^{a6}$ each independently represent a hydrogen atom, $-L^{a1}-CO_2H$, or $-L^{a1}-PO_3H_2$.

$L^{a1}$ represents a single bond or an alkylene group which may have a substituent.

The alkylene group may be chain-like, branched chain-like, or cyclic (may be monocyclic or polycyclic).

The number of carbon atoms in the alkylene group is preferably 1 to 10, more preferably 1 to 5, and even more preferably 1 or 2.

The alkylene group may further have a substituent. The substituent is preferably a hydroxy group or a carboxyl group.

As the alkylene group, a linear alkylene group is preferable, and a methylene group or an ethylene group is more preferable.

$L^{a2}$ each independently represents a single bond or an alkylene group which may have a substituent.

The alkylene group represented by $L^{a2}$ may be chain-like, branched chain-like, or cyclic (may be monocyclic or polycyclic).

The number of carbon atoms in the alkylene group is preferably 1 to 10, more preferably 1 to 5, and even more preferably 1 or 2.

The alkylene group may further have a substituent. The substituent is preferably a hydroxy group or a carboxyl group.

As the alkylene group, a linear or cyclic alkylene group is preferable, and a methylene group, an ethylene group, or a cyclohexylene group is more preferable.

$n_1$ represents an integer of 1 to 3. Especially, $n_1$ is preferably 1 or 2, and more preferably 1.

$n_2$ represents an integer of 0 to 3. Especially, $n_2$ is preferably 0 to 2.

There can be a plurality of $R^{a4}$'s, $R^{a5}$'s, and $L^{a2}$'s, and the plurality of $R^{a4}$'s, $R^{a5}$'s, and $L^{a2}$'s may be the same as or different from each other respectively.

Carboxylic Acid

The carboxylic acid is a compound having one or more carboxyl groups in a molecule.

Examples of the carboxylic acid include a monocarboxylic acid having one carboxyl group and a polycarboxylic acid having two or more carboxyl groups (for example, oxalic acid or the like).

Particularly, as the carboxylic acid, a polycarboxylic acid is preferable, a polycarboxylic acid having 2 to 5 carboxyl groups is more preferable, and a polycarboxylic acid having 4 to 5 carboxyl groups is even more preferable.

Examples of the carboxylic acid include a hydroxycarboxylic acid, an amino acid, an aliphatic carboxylic acid, and a monocarboxylic acid.

Hydroxycarboxylic Acid

The hydroxycarboxylic acid is a compound having one or more hydroxy groups and one or more carboxyl groups in a molecule.

Examples of the hydroxycarboxylic acid include malic acid, citric acid, glycolic acid, tartaric acid, and lactic acid. Among these, glycolic acid, malic acid, tartaric acid, or citric acid is preferable, and citric acid is more preferable.

Amino Acid

The amino acid is a compound having one or more amino groups and one carboxyl group in a molecule.

The amino acid is a compound different from the aforementioned components contained in the chemical liquid.

Examples of the amino acid include arginine, serine, α-alanine (2-aminopropionic acid), β-alanine (3-aminopropionic acid), lysine, leucine, isoleucine, cysteine, methionine, ethionine, threonine, tryptophan, tyrosine, valine, histidine, a histidine derivative, asparagine, glutamine, proline, phenylalanine, the compounds described in paragraphs "0021" to "0023" of JP2016-086094A, and salts of these.

As the histidine derivative, the compounds described in JP2015-165561A, JP2015-165562A, and the like can be cited, and the details thereof are incorporated into the present specification.

Examples of salts of the amino acid include alkali metal salts such as a sodium salt and a potassium salt, an ammonium salt, a carbonate, and an acetate.

Among these, as the amino acid, arginine or a sulfur-containing amino acid containing a sulfur atom is preferable. Examples of the sulfur-containing amino acid include cystine, cysteine, ethionine, and methionine. Among these, cystine or cysteine is preferable.

Aliphatic Carboxylic Acid

The aliphatic carboxylic acid is a compound having one or more aliphatic groups and one or more carboxyl groups in a molecule.

Examples of the aliphatic carboxylic acid include propionic acid, a lower (having 1 to 4 carbon atoms) aliphatic monocarboxylic acid such as butyric acid, malonic acid, succinic acid, glutaric acid, adipic acid, pimelic acid, sebacic acid, acetic acid, and maleic acid.

Among these, succinic acid or adipic acid is preferable.

Monocarboxylic Acid

The monocarboxylic acid is a compound having one carboxyl group in a molecule.

The monocarboxylic acid is a compound different from the aforementioned components contained in the chemical liquid.

Examples of the monocarboxylic acid include formic acid.

Aminopolycarboxylic Acid

The aminopolycarboxylic acid is a compound having one or more amino groups as a coordinating group and two or more carboxyl groups in a molecule.

Examples of the aminopolycarboxylic acids include aspartic acid, glutamic acid, butylenediaminetetraacetic acid, diethylenetriaminepentaacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid (CyDTA), ethylenediaminediacetic acid, ethylenediaminedipropionic acid, 1,6-hexamethylene-diamine- N,N,N',N'-tetraacetic acid, N,N-bis(2-hydroxybenzyl) ethylenediamine-N,N-diacetic acid, diaminopropanetetraacetic acid, 1,4,7,10-tetraazacyclododecane-tetraacetic acid, diaminopropanol tetraacetic acid, (hydroxyethyl)ethylenediaminetriacetic acid, and iminodiacetic acid (IDA).

Among these, as the aminopolycarboxylic acid, EDTA, DTPA, CyDTA, or IDA is preferable.

Phosphonic Acid

The phosphonic acid is a compound having one or more phosphonic acid groups in a molecule.

The phosphonic acid is a compound different from the aforementioned components contained in the chemical liquid.

The number of phosphonic acid groups that the phosphonic acid has is preferably 1 or more, more preferably 2 or more, even more preferably 2 to 10, particularly preferably 2 to 4, and most preferably 2 or 3.

Examples of the phosphonic acid include a compound represented by Formula (P1), a compound represented by Formula (P2), and a compound represented by Formula (P3).

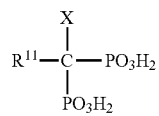
(P1)

In Formula (P1), X represents a hydrogen atom or a hydroxy group.

As X, a hydroxy group is preferable.

$R^{11}$ represents a hydrogen atom or an alkyl group having 1 to 10 carbon atoms.

The alkyl group having 1 to 10 carbon atoms represented by $R^{11}$ may be linear, branched, or cyclic.

As $R^{11}$, an alkyl group having 1 to 6 carbon atoms is preferable, and a methyl group, an ethyl group, a n-propyl group, or an isopropyl group is more preferable.

In the specific examples of the alkyl group described in the present specification, "n-" stands for "normal-"

Examples of the compound represented by Formula (P1) include ethylidene diphosphonic acid, 1-hydroxyethylidene-1,1'-diphosphonic acid (HEDP), 1-hydroxypropyridene-1,1'-diphosphonic acid, or 1-hydroxybutylidene-1,1'-diphosphonic acid is preferable.

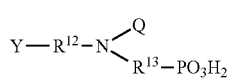
(P2)

In Formula (P2), Q represents a hydrogen atom or $R^{13}$—$PO_3H_2$.

As Q, —$R^{13}$—$PO_3H_2$ is preferable.

$R^{12}$ and $R^{13}$ each independently represent an alkylene group.

Examples of the alkylene group represented by $R^{12}$ include an alkylene group having 1 to 12 carbon atoms.

The alkylene group may be linear, branched, or cyclic, and is preferably linear or branched.

As the alkylene group represented by $R^{12}$, an alkylene group having 1 to 6 carbon atoms is preferable, an alkylene group having 1 to 4 carbon atoms is more preferable, and an ethylene group is even more preferable.

Examples of the alkylene group represented by $R^{13}$ include an alkylene group having 1 to 10 carbon atoms.

The alkylene group may be linear, branched, or cyclic, and is preferably linear or branched.

As the alkylene group, an alkylene group having 1 to 4 carbon atoms is preferable, a methylene group or an ethylene group is more preferable, and a methylene group is even more preferable.

Y represents a hydrogen atom, —$R^{13}$—$PO_3H_2$, or a group represented by Formula (P4).

As Y, a group represented by —$R^{13}$—$PO_3H_2$ or Formula (P4) is preferable, and a group represented by Formula (P4) is more preferable.

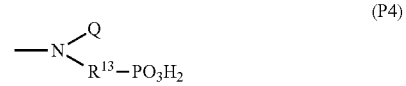
(P4)

In Formula (P4), Q and $R^{13}$ have the same definitions as Q and $R^{13}$ in Formula (P2).

As the compound represented by Formula (P2), ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediamine tetra(methylenephosphonic acid) (EDTMP), ethylenediamine tetra(ethylenephosphonic acid), 1,3-propylenediamine tetra(methylenephosphonic acid) (PDTMP), 1,2-diaminopropane tetra(methylenephosphonic acid), or 1,6-hexamethylenediamine tetra(methylenephosphonic acid) is preferable.

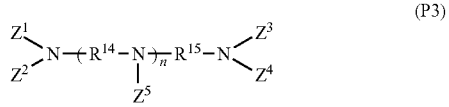
(P3)

In Formula (P3), $R^{14}$ and $R^{15}$ each independently represent an alkylene group having 1 to 4 carbon atoms.

The alkylene group having 1 to 4 carbon atoms represented by $R^{14}$ and $R^{15}$ may be linear or branched.

Examples of the alkylene group having 1 to 4 carbon atoms represented by $R^{14}$ and $R^{15}$ include a methylene group, an ethylene group, a propylene group, a trimethylene group, an ethylmethylene group, a tetramethylene group, a 2-methylpropylene group, a 2-methyltrimethylene group, and an ethylethylene group. Among these, an ethylene group is preferable.

n represents an integer of 1 to 4. Particularly, n is preferably an integer of 1 or 2.

Among $Z^1$ to $Z^4$ and n pieces of $Z^5$, at least four represent an alkyl group having a phosphonic acid group, and the rest represent an alkyl group.

Examples of the alkyl group represented by $Z^1$ to $Z^5$ and the alkyl group represented by $Z^1$ to $Z^5$ having a phosphonic acid group include a linear alkyl group having 1 to 4 carbon atoms and a branched alkyl group having 1 to 4 carbon atoms. Among these, a methyl group is preferable.

The number of phosphonic acid groups in the alkyl group having a phosphonic acid group represented by $Z^1$ to $Z^5$ is preferably 1 or 2, and more preferably 1.

Examples of the alkyl group having a phosphonic acid group represented by $Z^1$ to $Z^5$ include a linear or branched alkyl group that has 1 to 4 carbon atoms and 1 or 2 phosphonic acid groups. Among these, a (mono)phosphonomethyl group, or a (mono)phosphonoethyl group is preferable, and a (mono)phosphonomethyl group is more preferable.

Regarding $Z^1$ to $Z^5$, it is preferable that $Z^1$ to $Z^4$ and n pieces of $Z^5$ all represent the aforementioned alkyl group having a phosphonic acid group.

As the compound represented by Formula (P3), diethylenetriamine penta(methylenephosphonic acid) (DEPPO), diethylenetriamine penta(ethylenephosphonic acid), triethylenetetramine hexa(methylenephosphonic acid), or triethylenetetramine hexa(ethylenephosphonic acid) is preferable.

As the phosphonic acid, the compounds described in paragraphs "0026" to "0036" of WO2018/020878A and the compounds (co(polymers)) described in paragraphs "0031" to "0046" of WO2018/030006A can be cited, and the details thereof are incorporated into the present specification.

The number of carbon atoms in the phosphonic acid is preferably 12 or less, more preferably 10 or less, and even more preferably 8 or less. The lower limit thereof is not particularly limited, and is preferably 1 or more, and more preferably 2 or more.

As the phosphonic acid, the aforementioned compound represented by Formula (P1), compound represented by Formula (P2), or compound represented by Formula (P3) is preferable, and EDTMP or EDTA is more preferable.

Biguanide Compound

The biguanide compound is a compound having one or more biguanide groups in a molecule.

The biguanide compound may be a salt.

The number of biguanide groups that the biguanide compound has is not particularly limited. The biguanide compound may have two or more biguanide groups.

Examples of the biguanide compound include the compounds described in paragraphs "0034" to "0055" of JP2017-504190A, and the details thereof are incorporated into the present specification.

Examples of the biguanide compound include ethylene dibiguanide, propylene dibiguanide, tetramethylene dibiguanide, pentamethylene dibiguanide, hexamethylene dibiguanide, heptamethylene dibiguanide, octamethylene dibiguanide, 1,1'-hexamethylene bis(5-p-chlorophenyl) biguanide)(chlorhexidine), 2-(benzyloxymethyl)pentane-1, 5-bis(5-hexylbiguanide), 2-(phenylthiomethyl)pentane-1,5-bis(5-phenethylbiguanide), 3-(phenylthio)hexane-1,6-bis(5-hexylbiguanide), 3-(phenylthio)hexane-1,6-bis(5-cyclohexylbiguanide), 3-(benzylthio)hexane-1,6-bis(5-hexylbiguanide), and 3-(benzylthio)hexane-1,6-bis(5-cyclohexylbiguanide).

Examples of salts of the biguanide compound include a hydrochloride, an acetate, and a gluconate.

Examples of the chelating agent also include an inorganic acid-based chelating agent such as condensed phosphoric acid, in addition to the above.

Examples of the condensed phosphoric acid include pyrophosphoric acid, metaphosphoric acid, tripolyphosphoric acid, hexametaphosphoric acid, and salts thereof One chelating agent may be used alone, or two or more chelating agents may be used in combination.

The content of the chelating agent with respect to the total mass of the chemical liquid is preferably 0.01% to 10.0% by mass, more preferably 0.05% to 5.0% by mass, and even more preferably 0.05% to 1.0% by mass.

pH Adjuster

The chemical liquid may contain a pH adjuster.

Note that the aforementioned hypochlorous acids are not included in the pH adjuster.

As the pH adjuster, among the components contained in the chemical liquid, a compound capable of adjusting pH can also be used. Examples thereof include the buffer and chelating agent described above.

Examples of the pH adjusters include an inorganic acid, an organic acid, and an inorganic base.

Specific examples of the inorganic acid and the organic acid include sulfuric acid, nitric acid, and hydrofluoric acid. Among these, sulfuric acid is more preferable.

The sulfuric acid, nitric acid, and hydrofluoric acid mean aqueous solutions obtained by dissolving $H_2SO_4$, $HNO_3$, and HF in water respectively.

Specific examples of the inorganic base include an alkali metal hydroxide and an alkaline earth metal hydroxide.

Examples of the alkali metal hydroxide and the alkaline earth metal hydroxide include lithium hydroxide, sodium hydroxide, potassium hydroxide, and calcium hydroxide.

One pH adjuster may be used alone, or two or more pH adjusters may be used in combination.

The type of pH adjuster to be used may be appropriately selected and the content thereof may be appropriately adjusted, such that the pH of the chemical liquid falls into the preferred range which will be described later.

The chemical liquid according to the embodiment of the present invention may contain other components in addition to the components described above.

Those other components are not particularly limited, and examples thereof include known components. Examples of the components include the surfactants described in paragraph "0026" of JP2014-93407A, paragraphs "0024" to "0027" of JP2013-55087A, paragraphs "0024" to "0027" of JP2013-12614A, and the like.

In addition, examples of those other components include the additives (an anticorrosive and the like) disclosed in paragraphs '0017" to "0038" of JP2014-107434A, paragraphs "0033" to "0047" of JP2014-103179A, paragraphs "0017" to "0049" of JP2014-93407A, and the like.

Metal Content

The content (measured as ion concentration) of all the metals (metal elements of Fe, Co, Cu, Mg, Mn, Li, Al, Cr, Ni, Zn, Sn, and Ag) contained as impurities in the chemical liquid is preferably 5 ppm by mass or less, and more preferably 1 ppm by mass or less. The manufacturing of a state-of-the-art semiconductor element presupposes the necessity for a chemical liquid with higher purity. Therefore, the metal content is still more preferably a value less than 1 ppm by mass, that is, less than an order of ppm by mass, which is in other words equal to or less than an order of ppb by mass, particularly preferably in an order of ppt by mass, and most preferably substantially zero.

The metal content can be measured using, for example, an Agilent 8800 triple quadrupole ICP-MS (for semiconductor analysis, option #200).

As a method of reducing the metal content, for example, a purification treatment such as distillation or filtration using an ion exchange resin or a filter is performed at the stage of raw materials to be used for manufacturing the chemical liquid or at the stage following the manufacturing of the chemical liquid.

Examples of methods of reducing the metal content include, in addition to the above, using a container that is unlikely to cause the elution of impurities which will be described later, as a container for storing the raw materials or the manufactured chemical liquid. Examples of the method of reducing the metal content also include lining the interior wall of a pipe with a fluorine-based resin such that metal components are not eluted from the pipe and the like during the manufacturing of the chemical liquid.

Coarse Particles

It is preferable that the chemical liquid substantially do not contain coarse particles.

The coarse particles mean, for example, particles having a diameter of 0.1 μm or more in a case where the shape of the particles is regarded as a sphere. "Substantially do not contain coarse particles" means that in a case where the chemical liquid is measured using a commercially available measuring device by a light scattering-type liquid-borne particle measuring method, the number of particles having a diameter of 0.2 μm or more is 10 or less or the number of particles having a diameter of 0.1 μm or more is 100 or less in 1 mL of the chemical liquid.

The coarse particles contained in the chemical liquid are the particles such as dirt, dust, organic solids, and inorganic solids incorporated into the raw materials as impurities and the particles such as dirt, dust, organic solids, and inorganic solids mixed in as contaminants in the process of preparing the chemical liquid that remain as particles in the chemical liquid to the end without being dissolved.

The amount of the coarse particles present in the chemical liquid is measured in a liquid phase by using a commercially available measuring device for a light scattering-type liquid-borne particle measuring method employing a laser as a light source. Examples of the method of removing coarse particles include a treatment such as filtering.

Chemical Liquid Manufacturing Method

The manufacturing method of the chemical liquid is not particularly limited. For example, by mixing together the aforementioned components contained in the chemical liquid, it is possible to manufacture the chemical liquid. There is no particular limitation on the order and/or timing of mixing together the components described above. Examples thereof include a chemical liquid manufacturing method of sequentially adding hypochlorous acid, bromic acid, and optional components to a stirrer of a mixer filled with purified pure water and then thoroughly stirring the components such that the components are mixed together.

In a case where a buffer or a pH adjuster is used, examples of the chemical liquid manufacturing method include a method of adjusting the pH of the chemical liquid in advance and then mixing together components and a method of mixing together components and then adjusting the pH to a preset value by using a pH adjuster.

Chemical Liquid container

The chemical liquid may be stored in a container.

That is, the chemical liquid container according to an embodiment of the present invention has a container and the aforementioned chemical liquid stored in the container.

It is preferable that the container have light shielding properties.

Having light shielding properties means being capable of blocking at least light in an ultraviolet or near-ultraviolet region. Specifically, it is preferable that the container have a light transmittance of 5% or less for ultraviolet light or near-ultraviolet light.

The transmittance (%) of light of each wavelength can be determined using a commercially available spectrophotometer.

From the viewpoint of light shielding properties, the container preferably contains a coloring pigment.

Examples of the coloring pigment include organic pigments such as a quinacridone-based pigment having a quinacridone structure (hereinafter, also called "quinacridone-based pigment"), a phthalocyanine-based pigment having a phthalocyanine structure (hereinafter, also called "phthalocyanine-based pigment"), an anthraquinone-based pigment having an anthraquinone structure, and an azo-based pigment having an azo structure (hereinafter, also called "azo-based pigment"), and inorganic pigments such as a carbon black-based pigment, an iron oxide-based pigment, an ultramarine-based pigment, and a titanium oxide-based pigment.

As the coloring pigment, among the above, inorganic pigments are preferable, a carbon black-based pigment, an iron oxide-based pigment, or a titanium oxide-based pigment is more preferable.

Examples of the quinacridone-based pigment include TET48183 (manufactured by TOYOCOLOR CO., LTD.) and TET78310 (manufactured by TOYOCOLOR CO., LTD.).

Examples of the phthalocyanine-based pigment include 7F2852 (manufactured by Dainichiseika Color & Chemicals Mfg. Co., Ltd.), TET58335 (manufactured by TOYOCOLOR CO., LTD.), and EPH-525328 (manufactured by Polycol Color Industries Co., Ltd.).

Examples of the azo-based pigment include TET38013 (manufactured by TOYOCOLOR CO., LTD.) and ECE 6293 (manufactured by Polycol Color Industries Co., Ltd.)

Examples of the carbon black-based pigment include TET01337 (manufactured by TOYOCOLOR CO., LTD.) and EPH-K-51680 (manufactured by Polycol Color Industries Co., Ltd.).

Examples of the iron oxide-based pigment include EPH-C-1045 (manufactured by Polycol Color Industries Co., Ltd.) and TET68473 (manufactured by TOYOCOLOR CO., LTD.).

Examples of the ultramarine-based pigment include EPH-B-46662 (manufactured by Polycol Color Industries Co., Ltd.) and TET26146 (manufactured by TOYOCOLOR CO., LTD.).

Examples of the titanium oxide-based pigment include EB1427 (manufactured by DIC Corporation), EPHH2481 (manufactured by Polycol Color Industries Co., Ltd.), and TET28318 (manufactured by TOYOCOLOR CO., LTD.).

Examples of the coloring pigment also include the pigments described in paragraphs "0029" to "0032" of JP2009-019204A, in addition to the above pigments.

One coloring pigment may be used alone, or two or more coloring pigments may be used.

The container may contain at least one component selected from the group consisting of an antioxidant and a light-fast stabilizer.

Regarding the antioxidant and the light-fast stabilizer, paragraphs "0064" and "0065" and "0075" and "0076" of JP2017-100766A can be cited, and the details thereof are incorporated into the present specification.

The container is not particularly limited as long as it contains a coloring pigment, and may be a container formed by mixing a material (for example, a resin) of the container body with a coloring pigment. Furthermore, the container may have a container body that contains a coloring pigment with which the interior wall or outer wall of the container body is coated by a known method and a light shielding layer that contains a coloring pigment.

As the material of the container body, a resin is preferable, and high-density polyethylene (HDPE), polyethylene (PE), polypropylene (PP), perfluoroalkoxyalkane (PFA), or polytetrafluoroethylene (PTFE) is more preferable. In addition, the resin may be used as a raw material of the light shielding layer.

It is preferable to use a container that has a high degree of cleanliness and is unlikely to cause elution of impurities.

Examples of the container include a "CLEAN BOTTLE" series manufactured by AICELLO CORPORATION, and "PURE BOTTLE" manufactured by KODAMA PLASTICS Co., Ltd.

Object to be Treated

The chemical liquid is used for removing a ruthenium-containing substance (hereinafter, also called "Ru-containing substance") on a substrate.

In the present specification, "on a substrate" includes, for example, all of the front and back, the lateral surfaces, and the inside of grooves of a substrate, and the like. The Ru-containing substance on a substrate includes not only a Ru metal-containing substance which is in direct contact with the surface of the substrate but also a Ru-containing substance which is on the substrate via another layer.

The ruthenium-containing substance contains ruthenium (Ru) as a transition metal.

The ruthenium-containing substance may contain a transition metal other than Ru.

Examples of the transition metal other than Ru include a metal M selected from Rh (rhodium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Jr (iridium).

The content of Ru atoms in the Ru-containing substance with respect to the total mass of the Ru-containing substance is preferably equal to or higher than 10% by mass, more preferably equal to or higher than 30% by mass, even more preferably equal to or higher than 50% by mass, and still more preferably equal to or higher than 90% by mass. The upper limit thereof is not particularly limited, and is 100% by mass or less for example.

The Ru-containing substance is not particularly limited as long as it is a substance containing Ru (Ru atom). Examples of the Ru-containing substance include simple Ru, an Ru-containing alloy, an oxide of Ru, a nitride of Ru, and an oxynitride of Ru.

The oxide, nitride, and oxynitride described above may be a composite oxide, a composite nitride, and a composite oxynitride containing Ru.

The object to be treated is a substrate having a Ru-containing substance. That is, the object to be treated includes at least a substrate and a Ru-containing substance on the substrate.

The type of substrate is not particularly limited, but is preferably a semiconductor substrate.

Examples of the substrate include a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and a combination of these.

The use of the object to be treated having been treated with the chemical liquid according to the embodiment of the present invention is not particularly limited. For example, such an object to be treated may be used for dynamic random access memory (DRAM), ferroelectric random access memory (FRAM (registered trademark)), magnetoresistive random access memory (MRAM), and phase change random access memory (PRAM), or may be used for a logic circuit, a processor, and the like.

The type of Ru-containing substance on the substrate is as described above.

The form of the Ru-containing substance on the substrate is not particularly limited. For example, the Ru-containing substance may be disposed in the form of a film (Ru-containing film), in the form of a wiring line (Ru-containing wiring line), or in the form of particles.

As described above, the transition metal may include Ru, and the object to be treated is preferably an object to be treated including a substrate and a Ru-containing film, a Ru-containing wiring line, or a particle-like Ru-containing substance which is disposed on the substrate.

Examples of the substrate, on which the Ru-containing substance is disposed in the form of particles, include a substrate obtained by performing dry etching on a substrate on which a Ru-containing film is disposed such that particle-like Ru-containing substances are then attached to the substrate as residues as will be described later, and a substrate obtained by performing a chemical mechanical polishing (CMP) treatment on the Ru-containing film such that particle-like Ru-containing substances are then attached to the substrate as residues as will be described later.

The thickness of the Ru-containing film is not particularly limited, and may be appropriately selected according to the use. For example, the thickness is preferably 200 nm or less, more preferably 100 nm or less, and even more preferably 50 nm or less. The lower limit thereof is not particularly limited, and is preferably 0.1 nm or more.

The Ru-containing film may be disposed only on one of the main surfaces of the substrate, or may be disposed on both the main surfaces of the substrate. Furthermore, the Ru-containing film may be disposed on the entire main surface of the substrate, or may be disposed on a portion of the main surface of the substrate.

The object to be treated may include various layers and/or structures as desired in addition to the Ru-containing substance. For example, a metal wire, a gate electrode, a source electrode, a drain electrode, an insulating layer, a ferromagnetic layer, and/or a non-magnetic layer, and the like may be disposed on the substrate.

The substrate may include an exposed integrated circuit structure. Examples of the integrated circuit structure include an interconnection mechanism such as a metal wire and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to the embodiment of the present invention has a Ru-containing substance on a substrate.

The manufacturing method of the object to be treated is not particularly limited. For example, a Ru-containing film can be formed on a substrate by a sputtering method, a chemical vapor deposition (CVD) method, a molecular beam epitaxy (MBE) method, an atomic layer deposition (ALD), or the like. In a case where the Ru-containing film is formed by a sputtering method, a CVD method, or the like, sometimes the Ru-containing substance is also attached to the back surface of the substrate on which the Ru-containing film is disposed (the surface opposite to the side of the Ru-containing film).

Furthermore, a Ru-containing wiring line may be formed on a substrate by performing the aforementioned method via a predetermined mask.

In addition, a substrate on which a Ru-containing film or a Ru-containing wiring line is disposed may be subjected to a predetermined treatment and used as an object to be treated by the treatment method according to the embodiment of the present invention.

For example, by performing dry etching on a substrate on which a Ru-containing film or a Ru-containing wiring line is disposed, a substrate having dry etching residues containing Ru may be manufactured. Furthermore, by performing CMP on a substrate on which a Ru-containing film or a Ru-containing wiring line is disposed, a substrate having a Ru-containing substance may be manufactured.

Method for Treating Substrate

The method for treating a substrate according to the embodiment of the present invention (hereinafter, also called "present treatment method") includes a step A of removing a Ru-containing substance on a substrate by using the chemical liquid described above.

As described above, the Ru-containing substance may contain Ru.

In addition, the substrate with a Ru-containing substance that is disposed on the substrate, which is an object to be treated by the present treatment method, is as described above.

Examples of the specific method of the step A include a method of bringing the substrate as an object to be treated, on which a Ru-containing substance is disposed, into contact with the chemical liquid.

The method of bringing the substrate into contact with the chemical liquid is not particularly limited, and examples thereof include a method of immersing the object to be treated in the chemical liquid put in a tank, a method of spraying the chemical liquid onto the object to be treated, a method of causing the chemical liquid to flow on the object to be treated, and a combination of these. Among these, the method of immersing the object to be treated in the chemical liquid is preferable.

In order to further enhance the cleaning ability of the chemical liquid, a mechanical stirring method may also be used.

Examples of the mechanical stirring method include a method of circulating the chemical liquid on an object to be treated, a method of causing the chemical liquid to flow on the object to be treated or spraying the chemical liquid onto the object to be treated, a method of stirring the chemical liquid by using ultrasonic or megasonic waves, and the like.

The treatment time of the step A can be appropriately adjusted. The treatment time (the contact time between the chemical liquid and the object to be treated) is not particularly limited, but is preferably 0.25 to 10 minutes, and more preferably 0.5 to 2 minutes.

The temperature of the chemical liquid during the treatment is not particularly limited, but is preferably 20° C. to 75° C., more preferably 20° C. to 60° C., even more preferably 40° C. to 65° C., and still more preferably 50° C. to 65° C.

In the step A, a treatment may be performed in which while the concentration of the hypochlorous acids, bromic acid, and/or chloric acid in the chemical liquid is being measured and, as necessary, a solvent (preferably water) is added to the chemical liquid. In a case where this treatment is performed, the concentration of components in the chemical liquid can be stably maintained in a predetermined range.

Specifically, examples of suitable embodiments of the step A include a step A1 of performing a recess etching treatment on a Ru-containing wiring line disposed on a substrate by using the chemical liquid, a step A2 of removing a Ru-containing film on outer edges of a substrate, on which the Ru-containing film is disposed, by using the chemical liquid, a step A3 of removing a Ru-containing substance attached to a back surface of a substrate, on which a Ru-containing film is disposed, by using the chemical liquid, a step A4 of removing a Ru-containing substance on a substrate, which has undergone dry etching, by using the chemical liquid, and a step A5 of removing a Ru-containing substance on a substrate, which has undergone a chemical mechanical polishing treatment, by using the chemical liquid.

Among these, as the step A, the step A2 or the step A3 is more preferable.

Hereinafter, the present treatment method used in each of the above treatments will be described.

Step A1

Examples of the step A include a step A1 of performing a recess etching treatment on a Ru-containing wiring line disposed on a substrate by using the chemical liquid.

FIG. 1 is a schematic cross-sectional top view showing an example of a substrate having a Ru-containing wiring line (hereinafter, also called "wiring board") which is an object to be treated by the recess etching treatment in the step A1.

A wiring board 10a shown in FIG. 1 has a substrate not shown in the drawing, an insulating film 12 having a groove disposed on the substrate, a barrier metal layer 14 disposed along the interior wall of the groove, and a Ru-containing wiring line 16 that fills up the inside of the groove.

The substrate and the Ru-containing wiring line in the wiring board are as described above.

It is preferable that the Ru-containing wiring line contain simple Ru, an alloy of Ru, an oxide of Ru, a nitride of Ru, or an oxynitride of Ru.

The material constituting the barrier metal layer in the wiring board is not particularly limited, and examples thereof include TiN and TaN.

In FIG. 1, an embodiment is illustrated in which the wiring board has a barrier metal layer. However, the wiring board may not have the barrier metal layer.

The method for manufacturing the wiring board is not particularly limited, and examples thereof include a method having a step of forming an insulating film on a substrate, a step of forming a groove in the insulating film, a step of forming a barrier metal layer on the insulating film, a step of forming a Ru-containing film that fills up the groove, and a step of performing a smoothing treatment on the Ru-containing film.

In the step A1, by performing a recess etching treatment on the Ru-containing wiring line in the wiring board by using the aforementioned chemical liquid, a portion of the Ru-containing wiring line can be removed, and a recess can be formed.

Figure 2:
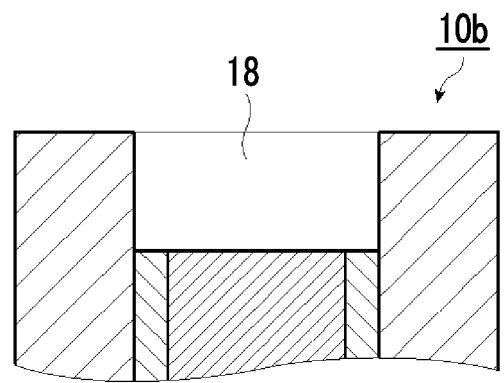
FIG. 2 is a schematic cross-sectional top view showing an example of an object to be treated having undergone the step A1.

More specifically, in a case where the step A1 is performed, as shown in the wiring board 10b in FIG. 2, a portion of the barrier metal layer 14 and the Ru-containing wiring line 16 is removed, and a recess 18 is formed.

Examples of the specific method of the step A1 include a method of bringing the wiring board into contact with the chemical liquid.

The method of bringing the wiring board into contact with the chemical liquid is as described above.

The suitable ranges of the contact time between the chemical liquid and the wiring board and the temperature of the chemical liquid are as described above.

Step B

Before or after the step A1, as necessary, a step B of treating the substrate obtained by the step A1 by using a predetermined solution (hereinafter, also called "specific solution") may be performed.

Particularly, as described above, in a case where the barrier metal layer is disposed on the substrate, the solubility in the chemical liquid according to the embodiment of the present invention varies between the component constituting the Ru-containing wiring line and the component constituting the barrier metal layer depending on the type of components. In this case, it is preferable to adjust the degree of solubility of the Ru-containing wiring line and the barrier metal layer by using a solution that dissolves better the barrier metal layer.

In this respect, as the specific solution, a solution is preferable which poorly dissolves the Ru-containing wiring line but excellently dissolves the substance constituting the barrier metal layer.

Examples of the specific solution include a solution selected from the group consisting of a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), and a mixed solution of hydrochloric acid and aqueous hydrogen peroxide (HPM).

The composition of FPM is, for example, preferably in a range of "hydrofluoric acid:aqueous hydrogen peroxide:water=1:1:1" to "hydrofluoric acid:aqueous hydrogen peroxide:water=1:1:200" (volume ratio).

The composition of SPM is, for example, preferably in a range of "sulfuric acid:aqueous hydrogen peroxide:water=3:1:0" to "sulfuric acid:aqueous hydrogen peroxide:water=1:1:10" (volume ratio).

The composition of APM is, for example, preferably in a range of "aqueous ammonia:aqueous hydrogen peroxide:water=1:1:1" to "aqueous ammonia:aqueous hydrogen peroxide:water=1:1:30" (volume ratio).

The composition of HPM is, for example, preferably in a range of "hydrochloric acid:aqueous hydrogen peroxide:water=1:1:1" to "hydrochloric acid:aqueous hydrogen peroxide:water=1:1:30" (volume ratio).

The preferred compositional ratio described above means a compositional ratio determined in a case where the content of hydrofluoric acid is 49% by mass, the content of sulfuric acid is 98% by mass, the content of aqueous ammonia is 28% by mass, the content of hydrochloric acid is 37% by mass, and the content of aqueous hydrogen peroxide is 31% by mass.

Among these, in view of dissolving ability for the barrier metal layer, SPM, APM, or HPM is preferable. In view of reducing roughness, APM, HPM, or FPM is preferable, and APM is more preferable. In view of achieving excellent balance between performances, APM or HPM is preferable.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the chemical liquid.

The contact time between the specific solution and the substrate obtained by the step A1 is, for example, preferably 0.25 to 10 minutes, and more preferably 0.5 to 5 minutes.

In the present treatment method, the step A1 and the step B may be alternately repeated.

In a case where the steps are alternately repeated, it is preferable that each of the step A1 and the step B be performed 1 to 10 times. Furthermore, in a case where the step A1 and the step B are alternately repeated, the step performed firstly and the step performed lastly may be any of the step A1 or the step B.

Step A2

Examples of the step A include a step A2 of removing a Ru-containing film at the outer edge of a substrate, on which the Ru-containing film is disposed, by using the chemical liquid.

Figure 3:
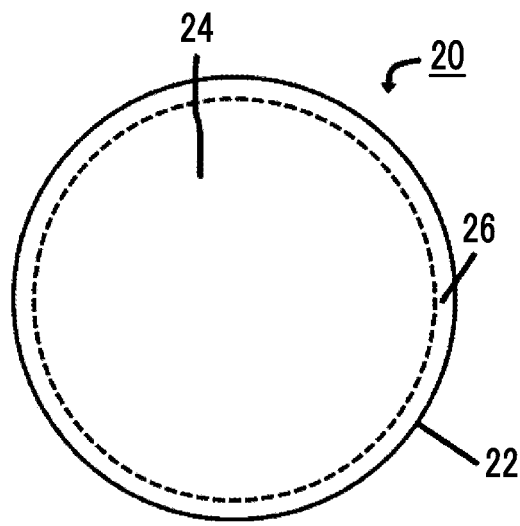
FIG. 3 is a schematic view showing an example of an object to be treated used in a step A2.

FIG. 3 is a schematic view (top view) showing an example of a substrate, on which a Ru-containing film is disposed, as an object to be treated by the step A2.

An object 20 to be treated by the step A2 shown in FIG. 3 is a laminate having a substrate 22 and a Ru-containing film 24 disposed on one main surface (entire region surrounded by the solid line) of the substrate 22. As will be described later, in step A2, the Ru-containing film 24 positioned at an outer edge 26 (the region outside the broken line) of the object 20 to be treated is removed.

The substrate and the Ru-containing film in the object to be treated are as described above.

It is preferable that the Ru-containing film contain simple Ru, an alloy of Ru, an oxide of Ru, a nitride of Ru, or an oxynitride of Ru.

The specific method of the step A2 is not particularly limited, and examples thereof include a method of supplying the chemical liquid from a nozzle such that the chemical liquid contacts only the Ru-containing film at the outer edge of the substrate.

At the time of performing the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the chemical liquid is as described above.

The suitable ranges of the contact time between the chemical liquid and the object to be treated and the temperature of the chemical liquid are as described above.

Step A3

Examples of the step A include a step A3 of removing a Ru-containing substance attached to the back surface of a substrate, on which a Ru-containing film is disposed, by using the chemical liquid.

Examples of the object to be treated by the step A3 include the object to be treated used in the step A2. At the time of forming the object to be treated, which is constituted with a substrate and a Ru-containing film disposed on one main surface of the substrate, used in the step A2, the Ru-containing film is formed by sputtering, CVD, or the like. At this time, sometimes a Ru-containing substance is attached to a surface (back surface) of the substrate that is opposite to the Ru-containing film. The step A3 is performed to remove such a Ru-containing substance in the object to be treated.

The specific method of the step A3 is not particularly limited, and examples thereof include a method of spraying the chemical liquid such that the chemical liquid contacts only the back surface of the substrate.

The method of bringing the object to be treated into contact with the chemical liquid is as described above.

The suitable ranges of the contact time between the chemical liquid and the object to be treated and the temperature of the chemical liquid are as described above.

Step A4

Examples of the step A include a step A4 of removing a Ru-containing substance on a substrate, which has undergone dry etching, by using the chemical liquid.

Figure 4:
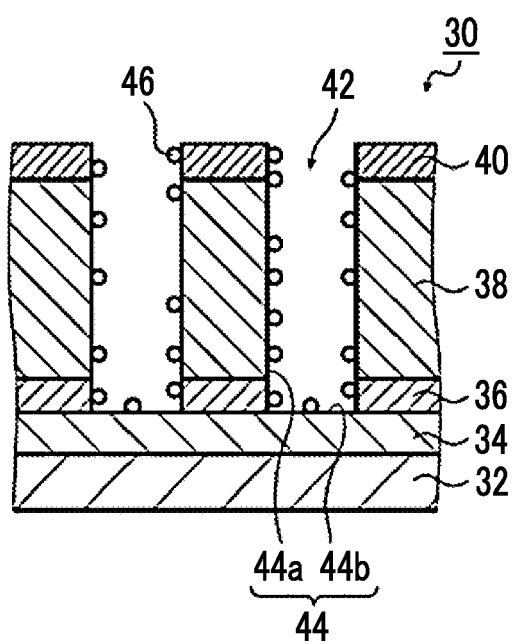
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a Ru-containing film 34, an etching stop layer 36, an interlayer insulating film 38, a metal hard mask 40 in this order on a substrate 32. Through a dry etching process or the like, a hole 42 exposing the Ru-containing film 34 is formed at a predetermined position. That is, the object to be treated shown in FIG. 4 is a laminate which comprises the substrate 32, the Ru-containing film 34, the etching stop layer 36, the interlayer insulating film 38, and the metal hard mask 40 in this order and comprises the hole 42 that extends from the surface of the metal hard mask 40 to the surface of the Ru-containing film 34 at the position of the opening portion of the metal hard mask 40. An interior wall 44 of the hole 42 is constituted with a cross-sectional wall 44a which includes the etching stop layer 36, the interlayer insulating film 38, and the metal hard mask 40, and a bottom wall 44b which includes the exposed Ru-containing film 34. A dry etching residue 46 is attached to the interior wall 44.

The dry etching residue includes a Ru-containing substance.

It is preferable that the Ru-containing film contain simple Ru, an alloy of Ru, an oxide of Ru, a nitride of Ru, or an oxynitride of Ru.

It is preferable that the Ru-containing substance contain simple Ru, an alloy of Ru, an oxide of Ru, a nitride of Ru, or an oxynitride of Ru.

As the interlayer insulating film and the metal hard mask, known materials are selected.

Although FIG. 4 describes an embodiment in which a metal hard mask is used, a resist mask formed of a known photoresist material may also be used.

Examples of the specific method of the step A4 include a method of bringing the aforementioned object to be treated into contact with the chemical liquid.

The method of bringing the wiring board into contact with the chemical liquid is as described above.

The suitable ranges of the contact time between the chemical liquid and the wiring board and the temperature of the chemical liquid are as described above.

Step A5

Examples of the step A include a step A5 of removing a Ru-containing substance on a substrate, which has undergone a chemical mechanical polishing (CMP), by using the chemical liquid.

The CMP technique is used for smoothing an insulating film, smoothing connection holes, and a process of manufacturing damascene wiring and the like. In some cases, a substrate having undergone CMP is contaminated with a large amount of particles used as abrasive particles, metal impurities, and the like. Therefore, it is necessary to remove these contaminants and wash the substrate before the next processing stage starts. By performing the step A5, it is possible to remove a Ru-containing substance which is generated in a case where the object to be treated by CMP includes a Ru-containing wiring line or a Ru-containing film and attached onto the substrate.

As described above, examples of the object to be treated by the step A5 include a substrate having undergone CMP that has a Ru-containing substance.

It is preferable that the Ru-containing substance contain simple Ru, an alloy of Ru, an oxide of Ru, a nitride of Ru, or an oxynitride of Ru.

Examples of the specific method of the step A5 include a method of bringing the aforementioned object to be treated into contact with the chemical liquid.

The method of bringing the wiring board into contact with the chemical liquid is as described above.

The suitable ranges of the contact time between the chemical liquid and the wiring board and the temperature of the chemical liquid are as described above.

Step C

As necessary, the present treatment step may have a step C of performing a rinsing treatment on the substrate obtained by the step A by using a rinsing liquid after the step A.

In a case where the substrate is brought into contact with the chemical liquid according to the embodiment of the present invention, sometimes a chlorine compound derived from the hypochlorous acids in the chemical liquid according to the embodiment of the present invention is attached to the surface of the substrate as residual chlorine (Cl residue). Such residual chlorine (Cl residue) may negatively affect the subsequent processes and/or end products. By performing the rinsing step, it is possible to remove the residual chlorine (Cl residue) from the surface of the substrate.

As the rinsing liquid, for example, hydrofluoric acid (preferably 0.001% to 1% by mass hydrofluoric acid), hydrochloric acid (preferably 0.001% to 1% by mass hydrochloric acid), aqueous hydrogen peroxide (preferably 0.5% to 31% by mass aqueous hydrogen peroxide, and more preferably 3% to 15% by mass aqueous hydrogen peroxide), a mixed solution of hydrofluoric acid and aqueous hydrogen peroxide (FPM), a mixed solution of sulfuric acid and aqueous hydrogen peroxide (SPM), a mixed solution of aqueous ammonia and aqueous hydrogen peroxide (APM), a mixed solution of hydrochloric acid and aqueous hydrogen peroxide (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), acetic acid (preferably an undiluted acetic acid solution or a 0.01% to 10% by mass aqueous acetic acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the preferred conditions required, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing liquids may be used by being mixed together.

Among the above, as the rinsing liquid, in view of further reducing chlorine remaining on the surface of the substrate after the rinsing step, aqueous carbon dioxide, aqueous ozone, aqueous hydrogen, hydrofluoric acid, an aqueous citric acid solution, hydrochloric acid, sulfuric acid, aqueous ammonia, aqueous hydrogen peroxide, SPM, APM, HPM, IPA, an aqueous hypochlorous acid solution, aqua regia, or FPM is preferable, and hydrofluoric acid, hydrochloric acid, aqueous hydrogen peroxide, SPM, APM, HPM, or FPM is more preferable.

Examples of the specific method of the step C include a method of bringing the substrate as an object to be treated obtained by the step A into contact with the rinsing liquid.

The method of bringing the substrate into contact with the rinsing liquid is performed by immersing the substrate in the rinsing solution put in a tank, spraying the rinsing liquid onto the substrate, causing the rinsing liquid to flow on the substrate, or any combination of these.

The treatment time (contact time between the rinsing liquid and the object to be treated) is not particularly limited, but is 5 seconds to 5 minutes for example.

The temperature of the rinsing liquid during the treatment is not particularly limited. Generally, the temperature of the rinsing liquid is preferably 16° C. to 60° C., and more preferably 18° C. to 40° C. In a case where SPM is used as the rinsing liquid, the temperature thereof is preferably 90° C. to 250° C.

As necessary, the present treatment method may have a step D of performing a drying treatment after the step C. The method of the drying treatment is not particularly limited, and examples thereof include spin drying, causing a drying gas to flow on the substrate, heating the substrate by heating means such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination before or after other steps performed on a substrate. While being performed, the present treatment method may be incorporated into those other steps. Alternatively, while those other steps are being performed, the present treatment method may be incorporated into the steps and performed.

Examples of those other steps include a step of forming each structure such as a metal wire, a gate structure, a source structure, a drain structure, an insulating layer, a ferromagnetic layer and/or a non-magnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line). However, from the viewpoint of enabling the effects of the present invention to be further demonstrated, it is preferable to perform the present treatment method in the front end process.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

Preparation of Chemical Liquid

Tetramethylammonium hypochlorite and bromic acid at the contents described in the following table were added to ultrapure water, thereby preparing a mixed solution. Then, the mixed solution was thoroughly stirred with a stirrer, thereby obtaining a chemical liquid of Example 1.

Chemical liquids of examples and comparative examples shown in Tables 1 and 2 were prepared according to the manufacturing method of Example 1. All the raw materials used for preparing the chemical liquid were semiconductor grade high-purity raw materials. As necessary, chloric acid was added as chloric acids. The obtained chemical liquid was stored in a clean bottle (material: HDPE) (manufactured by AICELLO CHEMICAL CO., LTD., KODAMA PLASTICS Co., Ltd., model number 20SG-NH), and the chemical liquid is taken out of the container and used at the time of evaluation that will be described later. The chemical liquid taken out of the container did not have a problem such as deterioration.

Buffer

Phosphoric acid (pKa 12.67)
Aqueous ammonia (pKa 9.25)
Boric acid (pKa 9.15)
Glycine (pKa 9.78)
3-(Cyclohexylamino)-1-propanesulfonic acid (pKa 10.40)
4-(Cyclohexylamino)-1-butanesulfonic acid (pKa 10.70)

Chelating Agent

EDTA: ethylenediaminetetraacetic acid
DTPA: diethylenetriaminepentaacetic acid
IDA: iminodiacetic acid
CyDTA: trans-1,2-diaminocyclohexanetetraacetic acid
HEDP: 1-hydroxyethylidene-1,1'-diphosphonic acid
EDTMP: ethylenediaminetetra(methylenephosphonic acid)

Test

A wafer was prepared which was composed of a commercially available silicon wafer (diameter: 12 inches) and a 10 nm TaN layer as a barrier layer and a 40 nm Ru layer (layer composed of simple Ru) formed by a PVD method that were on one surface of the silicon wafer.

On the obtained wafer, by using a spin coater (POLOS manufactured by KYODO INTERNATIONAL, INC.) and each of the chemical liquids of examples and comparative examples, a removal treatment was performed at room temperature (25° C.), a chemical liquid jetting amount of 1 L/min, and a substrate rotation speed of 100 rpm for a predetermined time that will be described later. Then, to the substrate having undergone the removal treatment, ultrapure water used as a rinsing liquid was jetted at room temperature (25° C.) and a rinsing liquid jetting amount of 1 L/min for 30 seconds. Thereafter, the substrate was rotated for 1 minute at a substrate rotation speed of 1,000 rpm such that the substrate was dried.

Evaluation

Ru Dissolving Ability

In [Test] described above, by using an X-ray fluorescence spectrometer for thin film evaluation (XRF AZX-400, manufactured by Rigaku Corporation), the thickness of the Ru layer was measured before and after the wafer was subjected to the removal treatment for 30 seconds using each of the chemical liquids of examples and comparative examples. The Ru dissolving ability (the etching rate of the Ru layer (Å/min)) was evaluated from the difference between the thickness of the Ru layer before the treatment and the thickness of the Ru layer after the treatment.

Residual Na Amount and Residual Ru Amount

In [Test] described above, on the wafer, the removal treatment was performed using each of the chemical liquids of examples or comparative examples for a period of time long enough to overetch the substrate 120% (a period of time long enough to dissolve the Ru layer by 48 nm, which is calculated using the etching speed calculated by the Ru dissolving ability). For the wafer obtained in this way, by using a total reflection X-ray fluorescence spectrometer (TXRF-V310, manufactured by Rigaku Corporation), a residual Na amount ($10^{10}$ atoms/cm$^2$) and a residual Ru amount ($10^{10}$ atoms/cm$^2$) were measured.

The evaluation results are shown in Tables 1 and 2.

"Remainder" in the column of "Water" means that water makes up the rest of the chemical liquid other than the components described in Table 1.

The column of "(A)/(B)" represents the mass ratio of the content of hypochlorous acids (A) to the content of bromic acids (B).

The column of "Residual Na amount" represents the residual sodium amount.

The column of "Residual Ru amount" represents the residual ruthenium amount.

TABLE 1

| | | (A) Hypochlorous acids | | (B) Bromic acids | (C) Chloric acids | (D) Buffer | | (E) Chelating agent | |
|---|---|---|---|---|---|---|---|---|---|
| | Type | Content (% by mass) | Content (ppm by mass) | Content (ppm by mass) | Type | Content (% by mass) | Type | Content (% by mass) |
| Example 1 | Tetramethyl-ammonium hypochlorite | 2.0 | 10.0 | | | | | |
| Example 2 | Sodium hypochlorite | 2.0 | 1.0 | | | | | |
| Example 3 | Tetramethyl-ammonium hypochlorite | 2.0 | 13.0 | | | | | |
| Example 4 | Tetramethyl-ammonium hypochlorite | 0.5 | 0.1 | | | | | |
| Example 5 | Tetramethyl-ammonium hypochlorite | 2.0 | 0.002 | | | | | |

TABLE 1-continued

| | | | | | | |
|---|---|---|---|---|---|---|
| Example 6 | Tetramethyl-ammonium hypochlorite | 2.0 | 0.001 | | | |
| Example 7 | Tetramethyl-ammonium hypochlorite | 0.5 | 6.0 | | | |
| Example 8 | Tetramethyl-ammonium hypochlorite | 2.0 | 10.0 | 500.0 | | |
| Example 9 | Tetramethyl-ammonium hypochlorite | 0.9 | 0.1 | | | |
| Example 10 | Tetramethyl-ammonium hypochlorite | 2.5 | 1.0 | | Phosphoric acid | 0.1 |
| Example 11 | Tetramethyl-ammonium hypochlorite | 3.0 | 1.0 | | Aqueous ammonia | 0.1 |
| Example 12 | Tetramethyl-ammonium hypochlorite | 1.0 | 1.0 | | Boric acid | 0.1 |
| Example 13 | Sodium hypochlorite | 3.0 | 1.0 | | Glycine | 0.1 |
| Example 14 | Tetramethyl-ammonium hypochlorite | 2.0 | 5.0 | | 3-(Cyclohexylamino)-1-propanesulfonic acid | 0.1 |
| Example 15 | Tetramethyl-ammonium hypochlorite | 2.0 | 10.0 | | 4-(Cyclohexylamino)-1-butanesulfonic acid | 0.1 |
| Example 16 | Tetramethyl-ammonium hypochlorite | 2.0 | 10.0 | | EDTA | 0.2 |
| Example 17 | Tetramethyl-ammonium hypochlorite | 2.0 | 10.0 | 10.0 | DTPA | 0.1 |

| | Water | PH | (A)/(B) | Ru dissolving ability Å/mm | Residual Na amount ($10^{18}$ atoms/cm$^2$) | Residual Ru amount ($10^{19}$ atoms/cm$^2$) |
|---|---|---|---|---|---|---|
| Example 1 | Remainder | 12.5 | $2.0 \times 10^5$ | 150 | 2 | Less than 1 |
| Example 2 | Remainder | 12.8 | $2.0 \times 10^5$ | 160 | 30 | Less than 1 |
| Example 3 | Remainder | 12.3 | $1.5 \times 10^5$ | 120 | 3 | Less than 1 |
| Example 4 | Remainder | 12.5 | $5.0 \times 10^4$ | 101 | 2 | Less than 1 |
| Example 5 | Remainder | 12.5 | $1.0 \times 10^7$ | 148 | 2 | Less than 1 |
| Example 6 | Remainder | 12.5 | $2.0 \times 10^7$ | 140 | 2 | 2 |
| Example 7 | Remainder | 12.4 | $8.3 \times 10^7$ | 55 | 3 | Less than 1 |
| Example 8 | Remainder | 12.4 | $2.0 \times 10^5$ | 154 | 3 | 3 |
| Example 9 | Remainder | 12.1 | $9.0 \times 10^4$ | 92 | 2 | Less than 1 |
| Example 10 | Remainder | 12.3 | $2.5 \times 10^4$ | 150 | 2 | Less than 1 |
| Example 112 | Remainder | 11.2 | $3.0 \times 10^4$ | 198 | 2 | Less than 1 |
| Example 12 | Remainder | 11.1 | $1.0 \times 10^4$ | 123 | 2 | Less than 1 |
| Example 13 | Remainder | 11.4 | $3.0 \times 10^4$ | 188 | 2 | Less than 1 |
| Example 14 | Remainder | 11.3 | $4.0 \times 10^5$ | 154 | 2 | Less than 1 |
| Example 15 | Remainder | 11.6 | $2.0 \times 10^3$ | 143 | 2 | Less than 1 |
| Example 16 | Remainder | 11.5 | $2.0 \times 10^3$ | 155 | Less than 1 | Less than 1 |
| Example 17 | Remainder | 11.8 | $2.0 \times 10^5$ | 165 | Less than 1 | Less than 1 |

TABLE 2

| | (A) Hypochlorous acids | | (B) Bromic acids | (C) Chloric acids | (D) Buffer | | (E) Chelating agent | |
|---|---|---|---|---|---|---|---|---|
| | Type | Content (% by mass) | Content (ppm by mass) | Content (ppm by mass) | Type | Content (% by mass) | Type | Content (% by mass) |
| Example 18 | Tetramethyl-ammonium hypochlorite | 2.0 | 0.5 | | | | IDA | 0.4 |
| Example 19 | Sodium hypochlorite | 2.0 | 0.01 | | | | CyDTA | 0.05 |
| Example 20 | Tetramethyl-ammonium hypochlorite | 2.0 | 6.0 | | | | HEDP | 0.1 |
| Example 21 | Tetramethyl-ammonium hypochlorite | 2.0 | 10.0 | | | | EDTMP | 0.2 |
| Example 22 | Tetramethyl-ammonium hypochlorite | 2.0 | 1.0 | | | | IDA | 1.0 |
| Example 23 | Tetramethyl-ammonium hypochlorite | 1.0 | 10.0 | | Phosphoric acid | 0.1 | EDTA | 0.2 |
| Example 24 | Tetramethyl-ammonium hypochlorite | 5.0 | 1.0 | | | | | |
| Example 25 | Tetramethyl-ammonium hypochlorite | 2.0 | 0.1 | 0.001 | | | | |
| Example 26 | Tetramethyl-ammonium hypochlorite | 1.0 | 1.0 | 0.0001 | | | | |
| Example 27 | Tetramethyl-ammonium hypochlorite | 8.0 | 10.0 | 1.0 | | | | |
| Example 28 | Tetramethyl-ammonium hypochlorite | 0.2 | 0.1 | 10.0 | | | | |
| Example 29 | Tetramethyl-ammonium hypochlorite | 6.0 | 14.3 | | | | | |
| Example 30 | Tetramethyl-ammonium hypochlorite | 2.0 | 10.0 | 490.0 | | | | |
| Comparative Example 1 | Tetramethyl-ammonium hypochlorite | 2.0 | 20.0 | | | | | |
| Comparative Example 2 | Tetramethyl-ammonium hypochlorite | 3.0 | 0.0001 | | | | | |
| Comparative Example 3 | Tetramethyl-ammonium hypochlorite | 0.08 | 0.01 | | | | | |
| Comparative Example 4 | Tetramethyl-ammonium hypochlorite | 10.0 | 0.01 | | | | | |

| | Water | PH | (A)/(B) | Ru dissolving ability Å/mm | Residual Na amount ($10^{18}$ atoms/cm$^2$) | Residual Ru amount ($10^{19}$ atoms/cm$^2$) |
|---|---|---|---|---|---|---|
| Example 18 | Remainder | 11.1 | $4.0 \times 10^4$ | 172 | Less than 1 | Less than 1 |
| Example 19 | Remainder | 12.0 | $2.0 \times 10^5$ | 154 | Less than 1 | Less than 1 |
| Example 20 | Remainder | 11.8 | $3.3 \times 10^3$ | 172 | Less than 1 | Less than 1 |
| Example 21 | Remainder | 11.8 | $2.0 \times 10^5$ | 145 | Less than 1 | Less than 1 |
| Example 22 | Remainder | 9.8 | $2.0 \times 10^4$ | 188 | Less than 1 | Less than 1 |
| Example 23 | Remainder | 11.8 | $1.0 \times 10^5$ | 132 | Less than 1 | Less than 1 |
| Example 24 | Remainder | 12.8 | $5.0 \times 10^4$ | 415 | 9 | Less than 1 |

TABLE 2-continued

| | | | | | | |
|---|---|---|---|---|---|---|
| Example 25 | Remainder | 12.8 | $2.0 \times 10^5$ | 154 | 2 | Less than 1 |
| Example 26 | Remainder | 12.5 | $1.0 \times 10^4$ | 130 | 2 | 2 |
| Example 27 | Remainder | 12.8 | $8.0 \times 10^3$ | 590 | 60 | Less than 1 |
| Example 28 | Remainder | 12.8 | $2.0 \times 10^4$ | 60 | Less than 1 | Less than 1 |
| Example 29 | Remainder | 12.8 | $4.1 \times 10^3$ | 502 | 2 | Less than 1 |
| Example 30 | Remainder | 12.4 | $2.0 \times 10^5$ | 155 | 3 | 3 |
| Comparative Example 1 | Remainder | 12.3 | | 80 | 2 | 10 |
| Comparative Example 2 | Remainder | 12.1 | | 176 | 2 | 20 |
| Comparative Example 3 | Remainder | 12.1 | | 9 | Less than 1 | Less than 1 |
| Comparative Example 4 | Remainder | 12.9 | | 645 | 150 | Less than 1 |

From the results shown in Tables 1 and 2, it has been confirmed that the chemical liquid according to the embodiment of the present invention brings about the desired effect.

From the comparison between Examples 1 and 4 to 5 and Examples 6 to 7, it has been confirmed that the effect is further improved in a case where the mass ratio of the content of hypochlorous acid or a salt thereof to the content of bromic acid or a salt thereof is $1.0 \times 10^3$ to $1.0 \times 10^7$.

From the comparison between Examples 25, 28, and 30 and Examples 8 and 26, it has been confirmed that the effect is further improved in a case where the content of chloric acid or a salt thereof is 0.001 to 10.0 ppm by mass.

From the comparison between Examples 1 and 2, it has been confirmed that the effect is further improved in a case where hypochlorous acid or a salt thereof includes a quaternary ammonium salt of the hypochlorous acid.

From the comparison between Examples 16 to 23 and Example 1, it has been confirmed that the effect is further improved in a case where the chelating agent includes at least one chelating agent selected from the group consisting of a carboxylic acid, an aminopolycarboxylic acid, and phosphonic acid.

From the comparison between Examples 1, 3, 5, and 29 and Example 6, it has been confirmed that the effect is further improved in a case where the content of bromic acids is 0.002 to 15.0 ppm by mass with respect to the total mass of the chemical liquid.

Examples 31 and 32

By using the chemical liquid of Example 7 or 28 prepared by the method described above, a Ru metal film having undergone chemical mechanical polishing was washed to evaluate the washing performance (residue removal performance).

A wafer (diameter: 8 inches) having a Ru metal film on a surface thereof was polished using a polishing liquid (CSL9044C or BSL8176C (trade name, manufactured by Fujifilm Planar Solutions, LLC)) and FREX300S-II (polishing device, manufactured by EBARA CORPORATION.). The polishing pressure was 2.0 psi, and the polishing liquid supply rate was 200 mL/min. The polishing time was 60 seconds.

Then, each of the polished wafers was washed for 30 seconds by using the chemical liquid of Example 7 or 28 adjusted to room temperature (23° C.), and then dried.

By using a scanning electron microscope (SEM), whether or not defects having a length of 0.1 µm or more are on the polished surface of the obtained wafer was observed (observation range: 500 µm). As a result, it has been confirmed that none of the chemical liquids of examples leaves abnormally grown Ru or Ru oxide residues on the Ru metal film, which tells that the chemical liquids have excellent washing performance.

Examples 33 and 34

An interlayer insulating film consisting of SiOC is formed on a silicon wafer having a diameter of 8 inches, and a groove having a line-and-space pattern consisting of a 9 µm line and a 1 µm space is formed in the interlayer insulating film. A barrier layer (material: TaN, film thickness: 2 nm) is disposed in the groove along the shape of the groove. Furthermore, the groove is filled with Ru. A wafer was prepared in which a bulk layer consisting of Ru having a film thickness of 150 to 300 nm was formed on an upper portion of the line-and-space portion such that Ru overflowed from the groove.

The aforementioned wafer was polished using a polishing liquid (CSL9044C or BSL8176C (trade name, manufactured by Fujifilm Planar Solutions, LLC)) and FREX300S-II (polishing device, manufactured by EBARA CORPORATION.). The polishing pressure was 2.0 psi, and the polishing liquid supply rate was 200 mL/min. The polishing time was 60 seconds.

Then, each of the polished wafers was washed for 30 seconds by using the chemical liquid of Example 7 or 28 adjusted to room temperature (23° C.), and then dried.

By using a scanning electron microscope (SEM), the polished surface of the obtained wafer was observed. It has been confirmed that a defect derived from Ru and having a size of 0.1 µm or more does not exist on the exposed interlayer insulating film (observation range: 500 µm). As a result, it has been confirmed that none of the chemical liquids of examples leaves Ru residues on the wafer.

EXPLANATION OF REFERENCES

10a: wiring board before recess etching treatment of wiring line
10b: wiring board after recess etching treatment of wiring line
12: interlayer insulating film
14: barrier metal layer
16: ruthenium-containing wiring line
18: recess 20, 30: object
22: substrate
24: ruthenium-containing film
26: outer edge
32: substrate
34: ruthenium-containing film
36: etching stop layer
38: interlayer insulating film
40: metal hard mask
42: hole
44: interior wall
44a: cross-sectional wall
44b: bottom wall
46: dry etching residue

What is claimed is:

1. A chemical liquid used for removing a ruthenium-containing substance on a substrate, comprising:
    hypochlorous acid or a salt thereof; and
    bromic acid or a salt thereof,
    wherein a content of the hypochlorous acid or a salt thereof is 0.1% to 9.0% by mass with respect to a total mass of the chemical liquid, and
    a content of the bromic acid or a salt thereof is 0.001 to 15.0 ppm by mass with respect to the total mass of the chemical liquid.

2. The chemical liquid according to claim 1,
    wherein a mass ratio of the content of the hypochlorous acid or a salt thereof to the content of the bromic acid or a salt thereof is $1.0 \times 10^3$ to $1.0 \times 10^7$.

3. The chemical liquid according to claim 1, further comprising:
    chloric acid or a salt thereof,
    wherein a content of the chloric acid or a salt thereof is 0.0001 to 500.0 ppm by mass with respect to the total mass of the chemical liquid.

4. The chemical liquid according to claim 1,
    wherein the hypochlorous acid or a salt thereof includes a quaternary ammonium salt of the hypochlorous acid.

5. The chemical liquid according to claim 1, further comprising:
    a buffer,
    wherein the buffer includes at least one buffer selected from the group consisting of a boric acid buffer, an amine buffer, a phosphoric acid buffer, and an organic buffer.

6. The chemical liquid according to claim 1, further comprising:
    a chelating agent,
    wherein the chelating agent includes at least one chelating agent selected from the group consisting of a carboxylic acid, an aminopolycarboxylic acid, and phosphonic acid.

7. The chemical liquid according to claim 1,
    wherein a pH of the chemical liquid is 7.0 to 13.0.

8. A chemical liquid container comprising:
    a container that contains a coloring pigment; and
    the chemical liquid according to claim 1 that is stored in the container.

9. A method for treating a substrate, comprising:
    a step A of removing a ruthenium-containing substance on a substrate by using the chemical liquid according to claim 1.

10. The method for treating a substrate according to claim 9,
    wherein the step A is a step A1 of performing a recess etching treatment on a ruthenium-containing wiring line disposed on a substrate by using the chemical liquid, a step A2 of removing a ruthenium-containing film at an outer edge of a substrate, on which the ruthenium-containing film is disposed, by using the chemical liquid, a step A3 of removing a ruthenium-containing substance attached to a back surface of a substrate, on which a ruthenium-containing film is disposed, by using the chemical liquid, a step A4 of removing a ruthenium-containing substance on a substrate, which has undergone dry etching, by using the chemical liquid, or a step A5 of removing a ruthenium-containing substance on a substrate, which has undergone a chemical mechanical polishing treatment, by using the chemical liquid.

11. The chemical liquid according to claim 2, further comprising:
    chloric acid or a salt thereof,
    wherein a content of the chloric acid or a salt thereof is 0.0001 to 500.0 ppm by mass with respect to the total mass of the chemical liquid.

12. The chemical liquid according to claim 2,
    wherein the hypochlorous acid or a salt thereof includes a quaternary ammonium salt of the hypochlorous acid.

13. The chemical liquid according to claim 2, further comprising:
    a buffer,
    wherein the buffer includes at least one buffer selected from the group consisting of a boric acid buffer, an amine buffer, a phosphoric acid buffer, and an organic buffer.

14. The chemical liquid according to claim 2, further comprising:
    a chelating agent,
    wherein the chelating agent includes at least one chelating agent selected from the group consisting of a carboxylic acid, an aminopolycarboxylic acid, and phosphonic acid.

15. The chemical liquid according to claim 2,
    wherein a pH of the chemical liquid is 7.0 to 13.0.

16. A chemical liquid container comprising:
    a container that contains a coloring pigment; and
    the chemical liquid according to claim 2 that is stored in the container.

17. A method for treating a substrate, comprising:
    a step A of removing a ruthenium-containing substance on a substrate by using the chemical liquid according to claim 2.

18. The method for treating a substrate according to claim 17,
    wherein the step A is a step A1 of performing a recess etching treatment on a ruthenium-containing wiring line disposed on a substrate by using the chemical liquid, a step A2 of removing a ruthenium-containing film at an outer edge of a substrate, on which the ruthenium-containing film is disposed, by using the chemical liquid, a step A3 of removing a ruthenium-containing substance attached to a back surface of a substrate, on which a ruthenium-containing film is disposed, by using the chemical liquid, a step A4 of removing a ruthenium-containing substance on a substrate, which has undergone dry etching, by using the chemical liquid, or a step A5 of removing a ruthenium-containing substance on a substrate, which has undergone a chemical mechanical polishing treatment, by using the chemical liquid.

19. The chemical liquid according to claim 3,
    wherein the hypochlorous acid or a salt thereof includes a quaternary ammonium salt of the hypochlorous acid.

20. The chemical liquid according to claim 3, further comprising:
a buffer,
wherein the buffer includes at least one buffer selected from the group consisting of a boric acid buffer, an amine buffer, a phosphoric acid buffer, and an organic buffer.

* * * * *